United States Patent [19]

Masuda et al.

[11] 4,356,409

[45] Oct. 26, 1982

[54] LEVEL CONVERSION CIRCUIT

[75] Inventors: Kouji Masuda, Ohme; Masao Mizukami, Yokohama; Nobuaki Kitamura, Kodaira, all of Japan

[73] Assignees: Hitachi, Ltd.; Hitachi Ome Electric Co., Ltd., both of Tokyo, Japan

[21] Appl. No.: 157,853

[22] Filed: Jun. 9, 1980

[30] Foreign Application Priority Data

Jun. 29, 1979 [JP] Japan .................................. 54-81351
Sep. 3, 1979 [JP] Japan .................................. 54-111777
Dec. 27, 1979 [JP] Japan .................................. 54-169338

[51] Int. Cl.³ .......................... H03K 5/01; H03K 5/02
[52] U.S. Cl. .................................. 307/264; 307/455; 307/456; 307/475
[58] Field of Search ............... 307/264, 446, 448, 455, 307/456, 475

[56] References Cited

U.S. PATENT DOCUMENTS 3,974,402 8/1976 Fett et al. ............................ 307/475

OTHER PUBLICATIONS

J. C. Froment et al., "ECL to TTL Translator Driver", IBM Technical Disclosure Bulletin, vol. 21, No. 10, Mar. 1979, pp. 4074-4075.
Patent Abstracts of Japan, vol. 2, No. 104, 26.08.78, p. 5430 E 78.

Primary Examiner—John Zazworsky
Attorney, Agent, or Firm—Antonelli, Terry & Wands

[57] ABSTRACT

A level conversion circuit for converting a signal of a polarity to a signal of the opposite polarity has differential pair transistors, push-pull type output transistors adapted to receive the differential outputs of opposite phases from the differential pair transistors, a plurality of protective transistors for protecting the output transistors and a capacitance separation element connected between the common collector outputs of the plurality of protective transistors and the output of one of the differential pair transistors. The protective transistor prevents both of the differential outputs from simultaneously taking high level due to various operating conditions of the conversion circuit. Therefore, the deterioration or breakdown of the output transistors caused by the through current is avoided. The capacitance separation element also contributes to prevent the reduction of operation speed of the differential transistors caused by the collector capacitances of the plurality of protective transistors.

5 Claims, 6 Drawing Figures und Patent Number: 4,356,409

LEVEL CONVERSION CIRCUIT

LIST OF PRIOR ART

The following reference is cited to show the state of the art:

(1) Japanese Patent Laid-Open No. 98749/1975.

BACKGROUND OF THE INVENTION

The present invention relates to a level conversion circuit.

It is necessary to incorporate a level conversion circuit between the output of an emitter-coupled-logic circuit (referred to as ECL, hereinafter) and the input of a circuit, such as a transistor-transistor logic circuit (referred to as TTL, hereinafter) or an N-channel insulated gate field effect transistor (referred to as N-MOS).

Namely, an ECL circuit is operated typically by a negative source voltage, and its signal level changes within a negative voltage region with respect to the grounding potential of the circuit. On the other hand, a circuit such as a TTL circuit, a N-MOS circuit or the like operates with a positive power source voltage and the signal level changes within a positive voltage region with respect to the grounding potential of the circuit. Therefore, an interface must be provided between the output of the first circuit operating with a negative voltage and the input of the second circuit operating with positive source voltage.

In order to achieve high-speed operation and to reduce the power consumption, the level conversion circuit may be constituted by differential transistors adapted to receive two input signals of ECL signal level and transistors of single end push-pull construction adapted to receive differential output signals of reverse phases level-shifted by these differential transistors.

The differential outputs take a high level when both of the above-mentioned two inputs signal are open, so that the transistors of the single end push-pull arrangement are turned on. In order to avoid this, it is necessary to incorporate an input protecting transistor in the circuit.

In addition, since the level conversion circuit operates with two voltages of positive and negative levels, it is possible that both level-shift outputs may take a high level at the time of turning on of the power supply or due to a fluctuation of the applied voltage, resulting in a breakdown or deterioration of the push-pull output transistors due to an overcurrent in the latter. It is, therefore, necessary to employ another protective transistor for forcibly maintaining one level shift output substantially at the grounding potential.

The present inventors have found that, since these protective transistors are connected at their collectors to the differential output node, the parasitic capacitance of the differential output node is increased to lower the operation speed.

SUMMARY OF THE INVENTION

It is, therefore, an object of the invention to provide a level conversion circuit which operates stably and at a high speed.

According to a basic feature of the invention, the collector capacitances of a plurality of protective transistors are separated from the differential output capacitance by means of capacitance separating elements which comprise either a transistor or a Schottky diode.

DESCRIPTION OF THE PREFERRED EMBODIMENTS

Hereinafter, the invention will be fully described through preferred embodiments.

Figure 1:
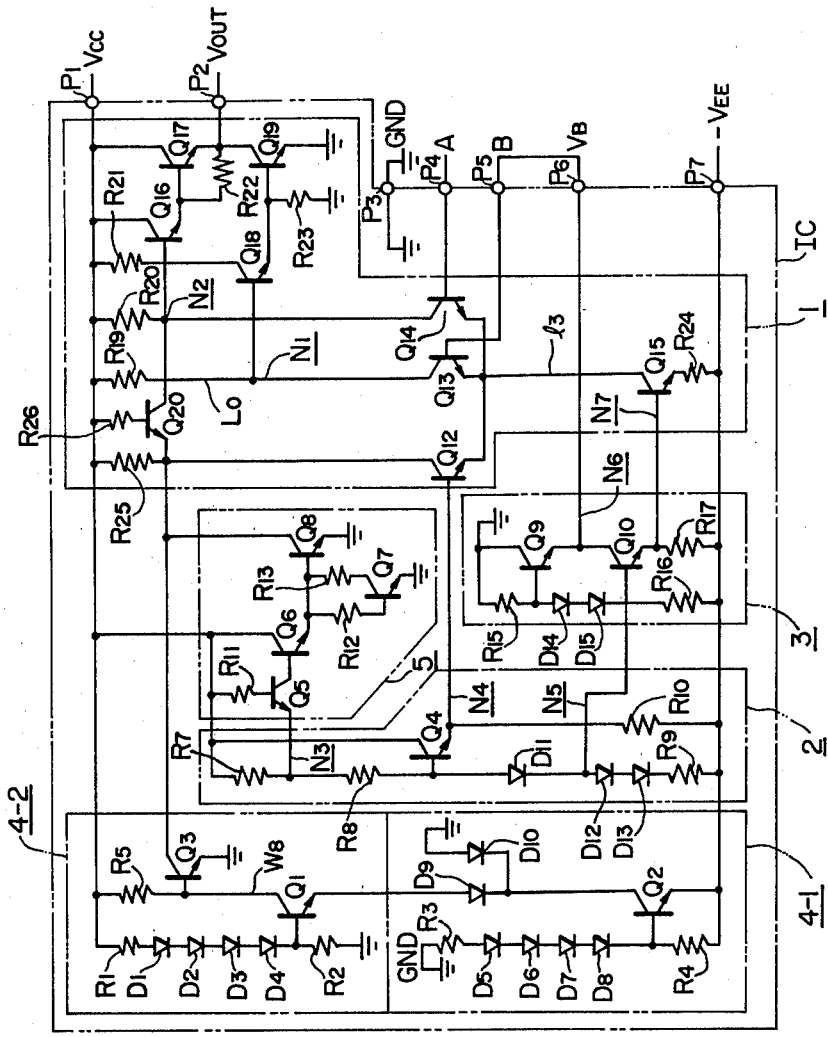
FIG. 1 is a circuit diagram of an embodiment of the invention.

Referring first to FIG. 1, a level conversion circuit in accordance with an embodiment of the invention is, but not exclusively, formed as a monolithic semiconductor integrated circuit (IC) having external terminals $P_1$ to $P_7$.

The terminal $P_1$ is supplied with a positive source voltage $V_{cc}$ of, for example +5 V, while the terminal $P_7$ receives a negative source voltage $-V_{EE}$ of, for example, −5.2 V. The terminal $P_3$ is maintained at the grounding potential GND of the circuit.

In FIG. 1, the portion 1 enclosed by two-dot-and-dash line constitutes a level conversion section, while portions 2,3 enclosed also by two-dot-and-dash lines constitute biasing sections. Portions 4-1, 4-2 and 5 constitute a source voltage detecting section.

The biasing section 2 includes resistors $R_7$ to $R_{10}$, transistor $Q_4$ and diodes $D_{11}$ to $D_{13}$, and is connected between the terminal $P_1$ and $P_7$.

This biasing section 2 generates bias voltages at the nodes $N_3$ to $N_5$, respectively, upon receipt of the positive and negative source voltages $V_{cc}$ and $-V_{EE}$.

The bias voltage of the node $N_3$ is used as the bias voltage for a source voltage detecting section 5, and is selected to be smaller than the sum 2 $V_{BE}$ of the base-emitter forward voltages $V_{BE}$ of the transistors $Q_6$ and $Q_8$ of the source voltage detecting section 5 when the source voltage $V_{cc}$ and $-V_{EE}$ are within correct ranges, and is made higher than 2 $V_{BE}$ when the positive source voltage $V_{cc}$ has been increased beyond the correct level and when the absolute value of the negative source voltage $-V_{EE}$ has come down below the correct level. The biasing voltage of the node $N_4$ is used as the biasing voltage for the base of the transistor $Q_{12}$ in the level conversion section 1. This base biasing voltage is selected to be lower than the level of the ECL signal applied to the external terminal $P_4$ or $P_5$ of the IC.

The bias voltage of the node $N_5$ is used as the biasing voltage for the transistor $Q_{10}$ of the biasing section 3.

The biasing section 3 is constituted by resistors $R_{15}$ to $R_{17}$, diodes $D_{14}$, $D_{15}$ and transistors $Q_9$, $Q_{10}$, and is connected between the grounding point GND of the circuit and the negative source terminal $P_7$. This biasing section 5 generates bias voltages at the nodes $N_6$ and $N_7$, respectively. The biasing voltage $V_B$ at the node $N_6$ is set to a medium level of the ECL signal level. For instance, if the high and low levels of the ECL signal are determined to be −0.89 V and −1.69 V, respectively, the reference bias voltage $V_B$ at the node $N_6$ is selected to be $-1.29$ V by a suitable setting of the resistors $R_{15}$ and $R_{16}$.

The bias voltage at the node $N_7$ is used as the base bias voltage for the current source transistor $Q_{15}$ of the level conversion section 1.

The level conversion section 1 is constituted mainly by a current source transistor $Q_{15}$ having an emitter resistance $R_{24}$, differential pair transistors $Q_{13}$, $Q_{14}$, collector load resistors $R_{19}$, $R_{20}$ for respective differential pair transistors, single end push-pull transistors $Q_{16}$ to $Q_{19}$ in the form of darlington connection, and resistors $R_{21}$ to $R_{23}$, and is connected between the power supply terminals $P_1$ and $P_7$.

The level conversion section 1 further has a transistor $Q_{20}$ and resistors $R_{25}$, $R_{26}$ which are specifically provided for enhancing the operation speed in accordance with the technical idea of the present invention.

Although not exclusive, the terminal $P_4$ is adapted to be supplied with an output signal A coming from an ECL circuit which is not shown, while the terminal $P_5$ receives the reference biasing voltage $V_B$ which is supplied by the biasing section 3 via the terminal $P_6$, by means of illustrated connection between the terminals outside the IC.

As a result, the differential pair transistors $Q_{13}$ and $Q_{14}$ make a differential operation in accordance with the ECL signal A supplied to the terminal $P_4$.

Namely, the transistors $Q_{13}$ and $Q_{14}$ are conductive and non-conductive, respectively, when the ECL signal A takes the low level. In this state, an electric current is supplied to the constant-current transistor $Q_{15}$ from the resistor $R_{19}$, through the transistor $Q_{13}$. The resistance value of the resistor $R_{19}$ and the constant current of the current source transistor $Q_{15}$ are beforehand selected suitably, such that the node $N_1$ takes substantially grounding potential GND, e.g. a low level of $+0.3$ V.

In contrast to the above, the node $N_2$ is made to take the high level substantially equal to the positive source voltage $V_{cc}$, by the non-conductive state of the differential transistor $Q_{14}$. Due to the low level of the node $N_1$, the transistors $Q_{18}$ and $Q_{19}$ of darlington connection are turned off, while the transistors $Q_{16}$, $Q_{17}$ are turned on as the node $N_2$ take the high level. In consequence, a high level signal of substantially $V_{cc} - 2 \cdot V_{BE}$ is delivered to the output terminal $P_2$.

In contrast, when the ECL signal A takes the high level, the states of the differential pair transistors $Q_{13}$, $Q_{14}$ are reversed to that of the case in which the same signal takes the low level. Namely, by a suitable selection of the resistance value of the resistor $R_{20}$, the node $N_2$ takes a low level substantially equal to the grounding potential GND. In this state, the darlington connection transistors $Q_{18}$, $Q_{19}$ are turned on by the high level potential at the node $N_1$, and the darlington connection transistors $Q_{16}$, $Q_{17}$ are turned off by the low level potential at the node $N_2$. In consequence, a low level signal substantially equal to the grounding potential GND is delivered to the output terminal $P_2$.

In the circuit shown in FIG. 1, as the absolute value of the negative source voltage $-V_{EE}$ is lowered, the bias voltage supplied to the transistor $Q_{10}$ becomes insufficient so that the emitter output current from this transistor $Q_{10}$ is reduced. Accordingly, the collector current of the current source transistor $Q_{15}$ of the level conversion section 1 is reduced.

Assuming here that the source voltage detecting section 5, negative voltage detecting section 4-1 and the positive voltage detecting section 4-2 are omitted from the circuit shown in FIG. 1, the output signal from the level conversion circuit is undesirably changed by the above-mentioned voltage fluctuation and, in addition, the single end push-pull transistors $Q_{16}$ to $Q_{19}$ are undesirably turned on to permit electric currents to flow therethrough.

More specifically, if one of the differential pair transistors, e.g. the transistor $Q_{13}$, of the level conversion section 1 takes the on state in response to the low level signal applied to the input A, the voltage drop across the resistor $R_{19}$ is decreased in accordance with the reduction of the collector current of the above-mentioned current source transistor $Q_{15}$. In consequence, the low level signal potential at the node $N_1$ is increased and, consequently, the transistors $Q_{18}$ and $Q_{19}$ are turned on undesirably. In this state, the level of the signal at the output terminal $P_2$, which is bound to take a high level by the transistors $Q_{16}$, $Q_{17}$ receiving the high level signal from the node $N_2$, starts to decrease undesirably toward the low level.

To the contrary, when the other differential transistor $Q_{14}$ takes the on state in response to the high level signal applied to the input A, the voltage drop across the resistor $R_{20}$ is decreased in accordance with the decrease of the collector current of the current source transistor $Q_{15}$, so that the potential of the low level signal at the node $N_2$ is raised to undesirably turn the transistors $Q_{16}$, $Q_{17}$ on. In this state, the level of the signal at the output terminal $P_2$, which is bound to take the low level by the transistors $Q_{18}$, $Q_{19}$ receiving the high level signal from the node $N_1$, is undesirably increased toward the high level, by the starting of turning on of the transistors $Q_{16}$, $Q_{17}$.

As the positive source voltage $V_{cc}$ is increased out of the predetermined range, the low level signal at the node $N_1$ or $N_2$ is undesirably increased toward the high level, because the voltage drop across the resistor $R_{19}$ or $R_{20}$ of the level conversion circuit 1 takes a substantially constant value which is determined by the current in the current source transistor $Q_{15}$. For instance, when the level of the signal applied to the input A is low, the potential at the node $N_1$, which should take the low level, is increased toward the high level in accordance with the increase of the positive source voltage $V_{cc}$. Therefore, the transistors $Q_{18}$, $Q_{19}$ which should take the off state are undesirably turned on in accordance with the increase of the potential at the node $N_1$.

To the contrary, when the positive source voltage $V_{cc}$ has come down below the predetermined range, the high level of the signal delivered to the output terminal $P_2$ can no more be regarded as being distinctive high level for the circuit connected to the output terminal $P_2$, e.g. the TTL circuit or N-MOS circuit.

As the signal at the terminal $P_2$ takes the undesirable level, the TTL circuit or the N-MOS circuit receiving the signal from the terminal $P_2$ does not operate at all or mal-functions.

The time lengths till the correct positive and negative source voltages $V_{cc}$, $-V_{EE}$ are established after turning on of the power supply differ depending on the circuit arrangements. If the turning on of the negative source $-V_{EE}$ materially lags behind the turning on the positive power source $V_{cc}$, the nodes $N_1$ and $N_2$ take the high level, substantially simultaneously within the time lag.

If the nodes $N_1$ and $N_2$ take the high level simultaneously due to an insufficient negative source voltage $-V_{EE}$, an excess of the positive power source $V_{cc}$ or time difference between the turning on of positive source and that of the negative source, the signal level at the output terminal $P_2$ is undesirably changed as stated above. At the same time, the push-pull output transistors $Q_{17}$ and $Q_{19}$ which are connected between the positive power supply terminal $P_1$ and the grounding terminal $P_3$ are simultaneously turned on, so that through current flows into these transistors $Q_{17}$, $Q_{19}$ from the power supply $V_{cc}$, causing a danger of deterioration or, in the worst case, breakdown of these transistors.

To avoid this, it is possible to insert a current limiting resistor (not shown) in the series circuit of the output transistors $Q_{17}$ and $Q_{19}$, to reduce the through current. This, however, poses a problem that, since the output current at the output terminal $P_2$ is undesirably limited by the above-mentioned current limiting resistor, it becomes difficult to supply the output terminal $P_2$ with a signal which drives the capacitive load at a high speed.

According to the invention, the undesirable change of the output signal level from the output terminal $P_2$, as well as the undesirable generation of the through current, is fairly avoided without requiring the use of the current limiting resistance, thanks to the use of the source voltage detecting section 5 and materially integral negative voltage detecting section 4-1 and positive voltage detecting section 4-2.

The source voltage detecting section 5 is constituted by resistors $R_{11}$ to $R_{13}$ and transistors $Q_5$ to $Q_8$ as illustrated. In the illustrated circuit, the transistors $Q_6$ and $Q_8$ are turned on when the biasing voltage at the node $N_3$ of the biasing section 2 becomes greater than the sum 2 $V_{BE}$ of the base-emitter forward voltage $V_{BE}$, and turned off when the same is decreased below 2 $V_{BE}$.

As stated before, the biasing voltage at the node $N_3$ takes a value smaller than 2 $V_{BE}$ when the positive and negative source voltages $V_{cc}$, $-V_{EE}$ are within correct ranges. In this state, the transistors $Q_8$ is kept off, and, therefore, does not limit at all the signal appearing at the node $N_2$ of the level conversion section 1.

The biasing voltage at the node $N_3$ becomes greater than 2 $V_{BE}$ as the positive source voltage $V_{cc}$ becomes excessively large or as the negative source voltage $-V_{EE}$ becomes excessively small. Accordingly, the transistor $Q_8$ is turned on to cause the transistor $Q_{20}$ to be turned on. Consequently, the node $N_2$ of the level conversion section 1 is grounded by the transistors $Q_8$, $Q_{20}$ to take the low level substantially equal to the grounding potential GND. In consequent, the undesirable simultaneous turning on of transistor $Q_{17}$ and $Q_{19}$ controlled by the nodes $N_1$ and $N_2$ is fairly avoided.

Figure 2:
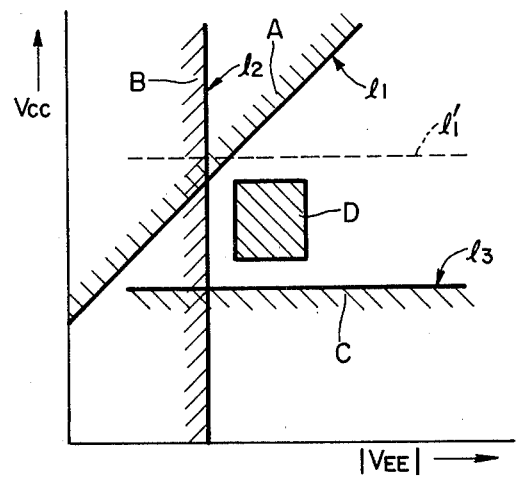
FIG. 2 is an illustration explanatory of the operation of the circuit shown in FIG. 1.

FIG. 2 shows respective operating regions of the voltage detecting sections 4-1, 4-2 and 5, representing the positive source voltage $V_{cc}$ and the negative source voltage $|V_{EE}|$ by axis of ordinate and axis of abscissa, respectively. In this Figure, a symbol D represents a region within the normal ranges of the positive and negative source voltages $V_{cc}$ and $-V_{EE}$.

The transistor $Q_8$ of the source voltage detecting section 5 in FIG. 1 is turned on at the region A above the line $l_1$ in FIG. 2.

The negative source voltage detecting section 4-1 includes, as illustrated, resistors $R_3$, $R_4$ connected in series between the grounding terminal $P_3$ and the negative power supply terminal $P_7$, diodes $D_5$ to $D_8$ and a transistor $Q_2$ connected at its base to the common connection point of the diode $D_8$ and the resistor $R_4$.

The above-mentioned transistor $Q_2$ is turned on and off as the absolute value $|V_{EE}|$ of the negative source voltage becomes higher and lower than the sum 5 $V_{BE}$ of the forward voltages $V_{BE}$ of the diodes $D_5$ to $D_8$ and the base-emitter forward voltage $V_{BE}$ of the transistor $Q_2$.

The positive source voltage detecting section 4-2 includes resistors $R_1$, $R_2$ and diodes $D_1$ to $D_4$ connected in series between the positive power supply terminal $P_1$ and the grounding terminal $P_3$, and a transistor $Q_1$ connected at its base to the common connection point between the diode $D_4$ and the resistor $R_2$. The collector of the transistor $Q_1$ is connected to the positive power supply terminal $P_1$ through the resistor $R_5$. The transistor $Q_3$ has a base connected to a common connecting point between the collector of the above-mentioned transistor $Q_1$ and the resistor $R_5$, while the collector and emitter thereof are connected commonly to the transistor $Q_8$.

The emitter of the transistor $Q_1$ is connected to the collector of the transistor $Q_2$ of the aforementioned negative source voltage detecting section 4-1 through a diode $D_9$. The cathode of the diode $D_9$ is connected to the grounding terminal $P_3$ through the diode $D_{10}$.

The potential at the emitter of the transistor $Q_1$ is maintained substantially at the grounding level GND when the transistor $Q_2$ of the negative source voltage detecting section 4-1 takes the on state due to the actions of the diodes $D_9$ and $D_{10}$, and is floating when the transistor $Q_2$ takes the off state.

The transistor $Q_1$ takes the on state when the positive source voltage $V_{cc}$ is greater than about 5 $V_{BE}$ while the above-mentioned transistor $Q_2$ is in the on state, and takes the off state when the positive source voltage $V_{cc}$ is below 5 $V_{BE}$ or when the transistor $Q_2$ takes the off state.

The negative source voltage detecting circuit 4-1 and the positive source voltage detecting circuit 4-2 are substantially integral with each other. When at least one of the positive and negative source voltages, $V_{cc}$ and $-V_{EE}$, in absolute value becomes below a predetermined level, caused from taking the off state of at least one of the transistor $Q_1$ and $Q_2$, the transistor $Q_1$ is turned off. Therefore, in this case, the collector of the transistor $Q_1$ having the load resistance $R_5$ provides a high level signal.

When the absolute values of the positive source voltage $V_{cc}$ and the negative source voltage $-V_{EE}$ takes the values exceeding predetermined levels simultaneously, the transistor $Q_1$ takes the on state, so that a low level signal of a level substantially equal to the grounding potential GND is obtained at the collector of the transistor $Q_1$.

The transistor $Q_3$ is turned on by the high level signal derived from the collector of the transistor $Q_1$ and is turned off by the low level signal from the same.

As will be understood from the foregoing description, if the absolute value of the positive source voltage $V_{cc}$ or the negative source voltage $-V_{EE}$ is smaller than a predetermined level, the transistor $Q_3$ takes the off state so that the emitter of the transistor $Q_{20}$ takes a level substantially equal to the grounding potential GND. Therefore, as has been described already, the node $N_2$ of the level conversion section 1 takes a low level substantially equal to the grounding potential GND, so that the nodes $N_1$ and $N_2$ are prevented from simultaneously taking the high level.

The negative source voltage detecting section 4-1 makes the node $N_2$ take the low level when the negative source voltage $-V_{EE}$ is at the region B to the left from a line $l_2$ of FIG. 2, while the positive source voltage detecting section 4-2 functions to make the node $N_2$ take the low level when the positive source voltage $V_{cc}$ is in the region C below a line $l_3$ in FIG. 2.

In the level conversion circuit shown in FIG. 1, the output terminal $P_2$ produces an output the level of which is forcibly maintained at the low level within these regions A and B. It is, therefore, possible to eliminate the through current flowing in the transistors $Q_{17}$ and $Q_{19}$. It is, therefore, possible to protect the output transistors $Q_{17}$ and $Q_{19}$ from deterioration or breakdown caused by the through current.

The emitter of the transistor $Q_{12}$ of the level conversion section 1 is connected to the emitters of the differential pair transistors $Q_{13}$, $Q_{14}$ while the collector thereof is connected to the collectors of the transistors $Q_3$ and $Q_8$. The transistor $Q_{12}$ receives at its base a biasing voltage of a level lower than the low level of the ECL signal which takes, for example, a high and low levels of $-0.89$ V and $-1.69$ V, respectively. Therefore, this transistor $Q_{12}$ takes the off state when the terminal $P_4$ receives an ECL signal A or when the terminal $P_5$ is in receipt of the bias voltage $V_B$ or the ECL signal B.

The transistor $Q_{12}$ takes the on state, when the input terminals $P_4$ and $P_5$ open simultaneously to simultaneously turn off the differential transistors $Q_{13}$ and $Q_{14}$. In consequence, the emitter of the transistor $Q_{20}$ takes the low level substantially equal to the grounding potential, so that the node $N_2$ is forcibly maintained at the low level as has been described already. The protective transistor $Q_3$ controlled by the positive and negative source voltage detecting sections 4-1, 4-2, the protective transistor $Q_8$ which is controlled by the source voltage detecting section 5 and the protective transistor $Q_{12}$ of the level convension section 1 in combination prohibit the nodes $N_1$ and $N_2$ from simultaneously taking the high level due to various reasons.

If the transistor $Q_{20}$ is eliminated and the collector of the protective transistors $Q_3$, $Q_8$ and $Q_{12}$ are commonly connected to the node $N_2$, the collector capacitances of these protective transistors $Q_3$, $Q_8$ and $Q_{12}$ are added to the collector capacitance of the differential transistor $Q_{14}$. This direct connection of collector capacitances of a multiplicity of transistors to the node $N_2$ seriously lowers the switching speed of the node $N_2$.

In the circuit shown in FIG. 1, the protective transistors $Q_3$, $Q_8$ and $Q_{12}$ are connected, in accordance with the technical idea of the invention, at their collectors to the emitter of the transistor $Q_{20}$ specifically provided for the separation of capacitance, so that the collector capacitances of these protective transistors $Q_3$, $Q_8$ and $Q_{12}$ can be separated from the node $N_2$. In consequence, only the collector capacitance of the transistor $Q_{20}$ is added to the capacitance of the node $N_2$, to realize a high-speed switching operation of the node $N_2$.

The described embodiments are not exclusive and can be modified in various manners. For instance, the output formed by a resistor $R_{25}$ between the common collectors of the protective transistors $Q_3$, $Q_8$ and $Q_{12}$ and the power supply terminal $P_1$ may be delivered to an inverter circuit constituted by a transistor and a resistor, the output from the inverter circuit being used for driving an npn transistor newly connected between the grounding terminal $P_3$ and the node $N_2$ or $N_1$. Alternatively the above-mentioned newly connected transistor may be driven by the output of a NAND circuit which receives outputs from collector load circuits of the protective transistors. It is also possible to use a diode, particularly a Schottky diode which can provide specifically small junction capacity, in place of the capacitance separation transistor $Q_{20}$ of the described embodiment. Further, it is possible to construct the capacitance separating transistor as a multi-emitter transistor having a multiplicity of emitters which receive outputs from load resistors connected to the collectors of the protective transistors.

The described forms of the source voltage detecting circuits 4-1, 4-2 and 5, as well as biasing circuits 2, 3, are not exclusive and may be modified and changed in various ways.

Figure 3:
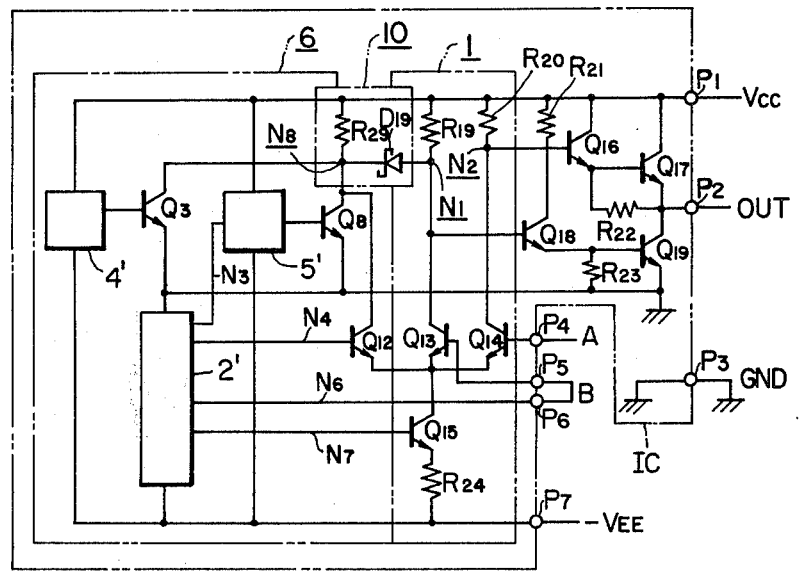
FIG. 3 is a circuit diagram of another embodiment of the invention.

FIG. 3 is a circuit diagram of another embodiment of the invention. The level conversion circuit of this embodiment is used in the interface between the output of a emitter-coupled logic (referred to as ECL, hereinunder) circuit and the input of a circuit such as a transistor-transistor logic (referred to as TTL) circuit or an N-channel insulated gate type field effect transistor (referred to as N-MOS) circuit.

Although not exclusive, the illustrated circuit is formed as a monolithic integrated circuit (IC) by the known technique, to have external terminals $P_1$ to $P_7$.

The above-mentioned terminal $P_1$ is adapted to receive a source voltage of $+5$ V, while the terminal $P_7$ receives a negative voltage of $-5.2$ V. The terminal $P_3$ is connected to the grounding potential GND.

The portion enclosed by two-dot-and-dash line 1 is a differential switching circuit constituted by a current source transistor $Q_{15}$ having an emitter resistor $R_{24}$, differential pair transistors $Q_{13}$, $Q_{14}$ and collector resistors $R_{19}$, $R_{20}$ of respective differential pair transistors.

A level substantially midpoint of the ECL signal level, e.g. a voltage of $-1.29$ V, is applied to the base of the above-mentioned differential pair transistor $Q_{13}$ through terminals $P_6$, $P_5$ from the biasing circuit 2. Therefore, the differential pair transistors $Q_{13}$ or $Q_{14}$ are turned on by application of ECL signal A to the base of the transistor $Q_{14}$ via the terminal $P_4$, so that a constant current from the current source transistor $Q_{15}$ is made to flow through the resistor $R_{19}$ or $R_{20}$ to generate a voltage drop. In consequence, signals of reverse phases are derived from the collectors of the transistors $Q_{13}$, $Q_{14}$ in accordance with the input signal of ECL level. In this case, resistors $R_{19}$ and $R_{20}$ are set at suitable levels so that the low levels of the collector output signals of these transistors $Q_{13}$, $Q_{14}$ takes a value substantially equal to the grounding potential, e.g. $+0.3$ V.

The collector outputs from the transistors $Q_{13}$, $Q_{14}$ are connected to the bases of the transistors $Q_{17}$, $Q_{19}$ of cascade connection, through emitter follower transistors $Q_{16}$, $Q_{18}$. In consequence, the output transistors $Q_{17}$ and $Q_{19}$ are actuated in reverse phases by the collector outputs from the differential pair transistors $Q_{13}$, $Q_{14}$.

In consequence, the output terminal $P_2$ produces an output signal OUT which is converted into positive voltage system corresponding to the negative voltage system input A of ECL level and which is strong enough to drive a heavy load such as capacitive load, e.g. an N-MOS memory.

This embodiment employs a protective circuit 6 adapted to forcibly maintain at the low level one of the output points of the differential switching circuit, e.g.

$N_1$, when the source voltages $V_{cc}$ and $-V_{EE}$ are out of predetermined ranges.

The output point $N_8$ of the protective circuit 6 is connected to the output point $N_1$ of the differential switching circuit 1 through the capacitance dividing circuit 10 of the invention.

The protective circuit 6 includes a circuit 4' for detecting the positive and negative source voltages $V_{cc}$, $-V_{EE}$, a circuit 5' for detecting the negative source voltage $-V_{EE}$, a biasing circuit 2' and protective transistors $Q_3$, $Q_8$ and $Q_{12}$. These detecting circuits 4', 5' are adapted to keep the protective transistor $Q_3$ or $Q_8$ in the on state when the source voltage falls out of the predetermined ranges. As a result, the output point $N_1$ can be maintained at a low level.

The protective transistor $Q_{12}$ is provided for preventing the outputs of the differential pair transistors $Q_{13}$, $Q_{14}$ from simultaneously taking a high level when the inputs of these transistors are opened simultaneously.

In the embodiment shown in FIG. 3, the output point $N_8$ of the protective circuit 6 and one output point $N_1$ of the differential switching circuit 1 are connected to each other through a diode $D_1$ whose cathode is connected to the above-mentioned output point $N_8$. Further, the output point $N_8$ and the power supply terminal $P_1$ are connected to each other through the resistor $R_{29}$.

As will be explained hereinunder, the capacitance dividing circuit 10 of the invention including the resistor $R_{29}$ and the diode $D_{19}$ has a function for enhancing the speed of rise of the potential at the output point $N_1$ from the low level to the high level.

Figure 4:
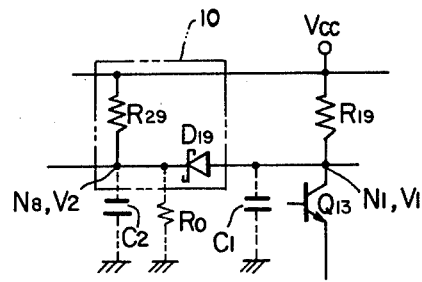
FIG. 4 is an equivalent circuit diagram explanatory of the circuit shown in FIG. 3.
Figure 5:
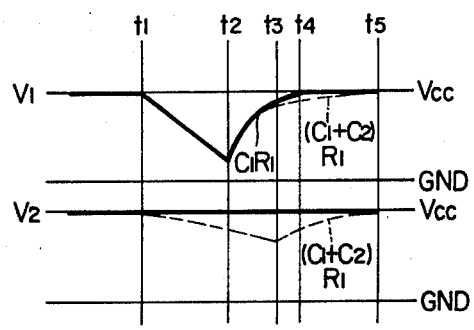
FIG. 5 shows wave forms of signals in the circuit shown in FIG. 4.

FIGS. 4 and 5 are illustrations of these functions. More specifically, FIG. 4 shows an equivalent circuit of a portion of the circuit shown in FIG. 3 including the resistors $R_{19}$, $R_{29}$, diode $D_{19}$ and the transistor $Q_{13}$. Capacitances $C_1$, $C_2$ are parasitic capacitances connected to the output points $N_1$ and $N_8$.

The capacitance $C_2$ is the capacitances of the protective transistors $Q_3$, $Q_8$ and $Q_{12}$, while the capacitance $C_1$ is the capacitances possessed by transistors $Q_{13}$, $Q_{18}$ and so forth.

Representing here the potentials at the output points $N_1$, $N_8$ by $V_1$ and $V_2$, respectively, wave forms of voltages $V_1$, $V_2$ are obtained as shown in FIG. 5. The wave form shown by broken line is obtained when the resistance $R_{29}$ is not connected.

The following explanation is made on an assumption that the protective transistors $Q_3$, $Q_8$ and $Q_{12}$ always take off state.

The voltages $V_1$, $V_2$ are maintained substantially at the same level as $V_{cc}$ when the transistor $Q_{13}$ is in the off state, because the capacitances $C_1$, $C_2$ are charged through the resistors $R_{19}$, $R_{29}$.

Then, as the transistor $Q_8$ is turned on at an instant $t_1$, the electric charge of the capacitance $C_1$ is discharged through the transistor $Q_{13}$ so that the voltage $V_1$ is made to approach the grounding potential GND. At this time, the diode $D_{19}$ is biased in backward direction. Meanwhile, the electric charge of the capacitance $C_2$ is discharged by a leakage current which flows through the resistance $R_0$. Therefore, in order to hold the voltage $V_2$ substantially at the level of $V_{cc}$, the resistance value of the resistor $R_{29}$ should be selected to be sufficiently small as compared with the resistance value of the leakage resistance $R_0$. In consequence, the resistance value of the resistor $R_{29}$ is selected to fall between about 1 KΩ to 100 KΩ.

On the other hand, in the event that the resistance $R_{29}$ is not connected, the electric charge of the capacitance $C_2$ is gradually discharged by the leakage current flowing through the resistor $R_0$, so that the voltage $V_2$ gradually approaches GND. This process is shown by broken line in FIG. 5.

Then, as the transistor $Q_{13}$ is turned off at an instant $t_2$, the capacitance $C_1$ is charged up through the resistor $R_{19}$. In consequence, the voltage $V_1$ rises with a time constant $C_1 R_{19}$ and reaches substantially $V_{cc}$ at the instant $t_4$.

On the other hand, when the resistor $R_{29}$ is not connected, the voltage $V_2$ gradually approaches GND as explained before. Therefore, representing the forward voltage of the diode $D_{19}$ by $V_{FD1}$, the diode $D_{19}$ is biased in forward direction at an instant $t_3$ at which the voltage $V_1$ becomes greater than the sum of the voltage $V_2 + V_{FD1}$. In consequence, the capacitance $C_2$ is charged through the resistor $R_{19}$ and the diode $D_{19}$. In consequence, a time constant $(C_1 + C_2) R_{19}$ is formed to delay the instant $t_5$ at which the voltage $V_1$ reaches a level substantially equal to $V_{cc}$. This state is shown by broken line of FIG. 5.

As has been described, the resistor $R_{29}$ and the diode $D_{19}$ function to maintain the voltage $V_2$ of the output point $N_8$ substantially at the same level as $V_{cc}$ to maintain a constant electric charge charging the capacitance $C_2$, so that the capacitance $C_2$ as viewed from the output point $N_1$ can be neglected equivalently. It is, therefore, possible to enhance the speed of rise of the voltage $V_1$ at the output point $N_1$. In this embodiment, it is preferred to use a Schottky barrier diode which can provide a specifically small junction capacitance, as the diode $D_{19}$.

Figure 6:
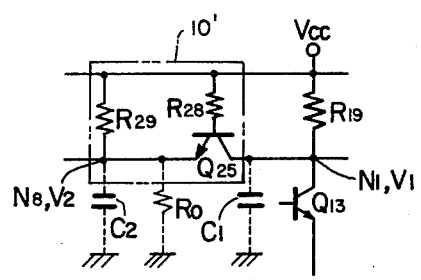
FIG. 6 is an equivalent circuit diagram explanatory of the present invention.

FIG. 6 shows a modification in which a transistor $Q_{25}$ is used as the switching element between the output points $N_1$ and $N_8$ of the embodiment shown in FIG. 4. The transistor $Q_{25}$ has the collector and emitter connected to the output points $N_1$ and $N_8$, respectively, while the base thereof is connected to the source voltage $V_{cc}$ through the resistor $R_{28}$.

In this modification also, the resistor $R_{29}$ and the transistor $Q_{25}$ function to maintain the potential $V_2$ at the output point $N_8$ of the protective circuit 6 substantially at the same level as $V_{cc}$ to keep a constant electric charge charging the capacitance $C_2$, so that the capacitance $C_2$ as viewed from the output point $N_1$ of the switching circuit 1 can be equivalently neglected. It is, therefore, possible to enhance the speed of rise of the voltage $V_1$ at the output point $N_1$.

The above-described embodiment is not exclusive. For instance, the switching circuit 1 and the protective circuit 6 for the latter may be constituted by insulated gate type field effect transistors.

What is claimed is:

1. A level conversion circuit comprising:
a first and a second input transistor connected to each other at their emitters in a differential manner, the base of said first input transistor being connected to receive a predetermined voltage level;
a first load connected between the collector of said first input transistor and a positive source voltage;
a second load connected between the collector of said second input transistor and said positive voltage;
a current source connected between the emitters of said first and second input transistors and a negative source voltage;

a first output transistor having a base adapted to be driven by the output from the collector of said second input transistor, a collector connected to said positive source voltage and an emitter connected to an output terminal;

a second output transistor having a base adapted to be driven by the collector output of said first input transistor, a collector connected to said output terminal and an emitter connected to a grounding terminal;

a source voltage detecting circuit adapted to detect at least one of said positive and negative source voltages and to provide an output signal indicating a state of the level thereof;

a first protective transistor having a base to which is applied a biasing voltage of a level lower than the predetermined voltage level to be applied to said first input transistor, a collector connected to said positive source voltage through a third load and an emitter connected to said emitters of said first and second input transistors;

a second protective transistor having a base adapted to receive the output signal from said source voltage detecting circuit, an emitter connected to the grounding terminal and a collector connected to the collector of said first protective transistor; and a capacitance separation element disposed between said collector of said second input transistor and said collectors of said first and second protective transistors.

2. A level conversion circuit as claimed in claim 1, wherein said source voltage detecting circuit includes means to turn on said second protective transistor when said positive source voltage is excessively high or when said negative source voltage is excessively low.

3. A level conversion circuit as claimed in claim 2, wherein said capacitance separation element is a capacitance separating transistor having an emitter connected to said collectors of said first and second protective transistors, a base connected to said positive source voltage through a resistor and a collector connected to said collector of said second input transistor.

4. A level conversion circuit as claimed in claim 2, wherein said capacitance separation element is a capacitance separation diode having a cathode connected to the collector of said first and second protective transistors and an anode connected to the collector of said second input transistor.

5. A level conversion circuit as claimed in claim 3 or 4, wherein an output of said level conversion circuit is derived from said output terminal and is delivered to an input terminal of an N-MOS circuit.

* * * * *